(12) United States Patent
Sato

(10) Patent No.: US 9,733,058 B2
(45) Date of Patent: Aug. 15, 2017

(54) PROXIMITY SENSOR

(75) Inventor: Shunichi Sato, Tokyo (JP)

(73) Assignee: Valeo Japan Co., Ltd., Saitama (JP)

( * ) Notice: Subject to any disclaimer, the term of this patent is extended or adjusted under 35 U.S.C. 154(b) by 462 days.

(21) Appl. No.: 14/129,724

(22) PCT Filed: Jun. 22, 2012

(86) PCT No.: PCT/JP2012/065970
§ 371 (c)(1),
(2), (4) Date: Apr. 17, 2014

(87) PCT Pub. No.: WO2013/002135
PCT Pub. Date: Jan. 3, 2013

(65) Prior Publication Data
US 2014/0225595 A1 Aug. 14, 2014

(30) Foreign Application Priority Data

Jun. 30, 2011 (JP) .................................. 2011-145175

(51) Int. Cl.
*G01B 7/00* (2006.01)
*H03K 17/95* (2006.01)
*G01D 5/14* (2006.01)

(52) U.S. Cl.
CPC ............. *G01B 7/003* (2013.01); *G01D 5/147* (2013.01); *H03K 17/9505* (2013.01); *H03K 17/9517* (2013.01)

(58) Field of Classification Search
CPC ............. G01B 7/00; G01B 7/14; G01R 33/09
See application file for complete search history.

(56) References Cited

U.S. PATENT DOCUMENTS 4,745,363 A    5/1988  Carr et al.
5,317,552 A *  5/1994  Yamasaki .......... G11B 7/08582
                                                    359/814

(Continued)

FOREIGN PATENT DOCUMENTS

JP    63-172957 A    7/1988
JP    02-048934       2/1990

(Continued)

OTHER PUBLICATIONS

International Search Report; Application No. PCT/JP2012/065970; Filed: Jun. 22, 2012. Completion of International Search Report: Jul. 13, 2012. (Form PCT/ISA/210).

*Primary Examiner* — Jermele M Hollington
*Assistant Examiner* — Alvaro Fortich
(74) *Attorney, Agent, or Firm* — Fishman Stewart PLLC

(57) ABSTRACT

A proximity sensor with high accuracy without being subject to an influence due to magnet variations is disclosed. A first yoke is insert-molded in an intermediate position between N and S poles of a magnet, and a projecting portion of the first yoke projects from a wall face of the magnet vertically to a magnetic pole face. A protruding portion of a second yoke opposes the projecting portion to arrange a main body portion in parallel with the wall face of the magnet, and a hall IC having a direction of connecting the projecting portion and the protruding portion as a magnetic responsive direction is arranged in a space between the projecting portion and the protruding portion.

8 Claims, 8 Drawing Sheets

(56) References Cited

U.S. PATENT DOCUMENTS

| | | | | |
|---|---|---|---|---|
| 5,369,361 A | * | 11/1994 | Wada | H03K 17/9517 307/116 |
| 5,903,076 A | * | 5/1999 | Suyama | B06B 1/045 310/13 |
| 6,809,619 B1 | * | 10/2004 | Xu | G01R 33/3873 324/320 |
| 2002/0008601 A1 | * | 1/2002 | Yajima | H01F 7/081 335/220 |
| 2003/0112006 A1 | * | 6/2003 | Luetzow | G01D 5/145 324/207.21 |
| 2004/0032253 A1 | | 2/2004 | Suzuki et al. | |
| 2004/0095141 A1 | * | 5/2004 | Watanabe | G01R 33/383 324/318 |
| 2004/0189287 A1 | * | 9/2004 | Suzuki | B60N 2/002 324/207.24 |
| 2005/0200449 A1 | * | 9/2005 | Oohashi | B82Y 25/00 338/32 R |
| 2006/0273679 A1 | * | 12/2006 | Iwase | H02K 1/276 310/156.53 |
| 2007/0194786 A1 | * | 8/2007 | Hatanaka | G01D 5/145 324/207.25 |
| 2008/0169892 A1 | * | 7/2008 | Komura | H01F 13/003 335/284 |
| 2010/0265806 A1 | * | 10/2010 | Matsushima | G01D 15/00 369/53.41 |
| 2011/0175480 A1 | * | 7/2011 | Booth | H02K 1/278 310/156.13 |

FOREIGN PATENT DOCUMENTS

| | | | |
|---|---|---|---|
| JP | 04-021964 | | 2/1992 |
| JP | 8-007232 | | 1/1996 |
| JP | 2001-215236 A | * | 8/2001 |
| JP | 2003-065705 | | 3/2003 |
| JP | 2006-047169 | | 2/2006 |
| JP | 4066716 | | 1/2008 |

* cited by examiner

PROXIMITY SENSOR

CROSS-REFERENCE TO RELATED APPLICATIONS

This application claims priority to Japanese Patent Application No. 2011-145175, filed Jun. 30, 2011, and International Patent Application No. PCT/JP2012/065970, filed Jun. 22, 2012, both of which are hereby incorporated by reference in their entirety.

BACKGROUND OF THE INVENTION

Field of the Invention

The present invention relates to a magnetic proximity sensor for detecting a position of a detected body in non-contact.

Description of the Related Art

This type of proximity sensor causes an increasing interest as a sensor that is excellent in a point that there does not exist degradation of the contact point due to contact that is made in a so-called contact point type switch. Therefore, for example, as an application of this type of proximity sensor to a vehicle, a pedal sensor, a door opening/closing sensor, a hood opening/closing sensor, a seat position sensor, a seat belt strapping sensor, and the like are under consideration. For example, Japanese Patent No. 4066716 discloses the conventional proximity sensor as follows. This proximity sensor comprises at least two opposing permanent magnets (hereinafter, called simply a magnet), a first yoke interposed between magnetic pole faces thereof, a protruding portion provided in the first yoke to extend in a vertical direction from an intermediate position between the magnets, a second yoke separated from the protruding portion, and a magnetic detection element arranged in a gap between the protruding portion and the second yoke. In addition, the two magnets are designed to have the same magnetic pole direction, and therefore N pole of one magnet opposes S pole of the other magnet to put the first yoke therebetween.

As a result, a position of a detected member made of a magnetic body moving in parallel with a projecting direction of the protruding portion is detected in a state of being separated from the magnets having the first yoke therebetween, the second yoke, and the like. That is, a magnetic line of one of the two magnets goes out from N pole, passes through a space, and returns back to S pole from the second yoke via the magnetic detection element and the protruding portion. A magnetic line of the other of the two magnets goes out from N pole, and returns back to S pole via the protruding portion, the magnetic detection element, the second yoke and the space. Therefore in a case where the detected member is not positioned to be close to the sensor, magnetic fluxes of the two magnets are reversed with each other in a region of the magnetic detection element, and the magnetic flux density that is detected by the magnetic detection element becomes zero. On the other hand, in a case where the detected member moves to a close position to the sensor, since the detected member becomes a part of a magnetic circuit of one magnet, most of the magnetic fluxes flow to the magnetic detection element via the detected member. In contrast, since the magnetic circuit of the other magnet has no change, the equilibrium of the magnetic flux in the region of the magnetic detection element is lost, and as a result the magnetic detection element detects a change in the magnetic flux density.

However, in the conventional proximity sensor, at least two magnets are required to be mounted to the first yoke to make the magnetic poles opposing with each other differ, and therefore, for preventing the event that a magnetic contamination substance is attached to the magnet at the time of the assembly of the sensor in a manufacturing line or the like and the equilibrium of the magnetic flux is lost regardless of the detected member is not positioned to be close to the sensor, the strict environment and the process management in the manufacturing line or the like are required.

In addition, since the permanent magnet originally varies a lot in the magnetic force depending on its individual, even if the assembly of the sensor in the manufacturing line is strictly managed, the magnetic fluxes of the two magnets in a region of the magnetic detection element do not necessarily come to equilibrium or change as desired. In fact, the detection position of the detected member varies a lot for each commercial product. However, any adjustment measure is not taken for overcoming this problem, and therefore it is still difficult to put this conventional proximity sensor into practice.

SUMMARY OF THE INVENTION

Therefore the present invention is made in view of the foregoing problems, and an object of the present invention is to provide a proximity sensor that can obtain a stable position detection performance by eliminating an adverse influence on a detection accuracy due to variations of a magnet or a need of excessive management in a manufacturing line.

According to an aspect of the present invention, a proximity sensor comprises a single permanent magnet, a first yoke that is held in an intermediate position between two magnetic pole faces of the permanent magnet and includes a projecting portion projecting from a wall face of the permanent magnet vertical to the magnetic pole face, a second yoke that includes a main body portion in parallel with the wall face of the permanent magnet from which the projecting portion projects and is arranged to have a space to the projecting portion, and a magnetic responsive element that is arranged in the space between the projecting portion and the second yoke, wherein the permanent magnet is arranged to position the magnetic pole face to be in parallel with the detected member moving relative thereto.

According to the aspect of the present invention, the proximity sensor can be formed of a simple structure comprising a fewer components by adopting the single magnet, and therefore can realize the detection with high accuracy by solving the problem of the variation in characteristics of the magnet that is unavoidable at the time of requiring a plurality of magnets. Further, since a set of the additional first yoke and the magnetic responsive element is shifted in the relative movement direction to the detected member to be provided between the magnet and the second yoke, the position of the detected member can be detected by a plurality of steps.

BRIEF DESCRIPTION OF THE DRAWINGS

Other objects, features, and advantages of the present invention will become more apparent from the following detailed description made with reference to the accompanying drawings, in which like parts are designated by like reference numbers and in which.

DESCRIPTION OF THE PREFERRED EMBODIMENTS

Hereinafter, a proximity sensor according to an embodiment in the present invention will be in detail explained with reference to the accompanying drawings.

First Embodiment

Figure 1C:
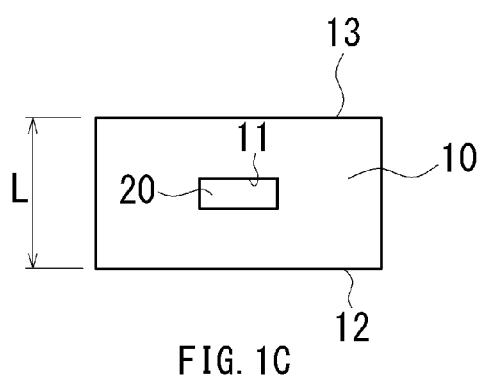
FIGS. 1A, 1B and 1C are diagrams each showing the configuration of a proximity sensor according to a first embodiment in the present invention.
Figure 1A:
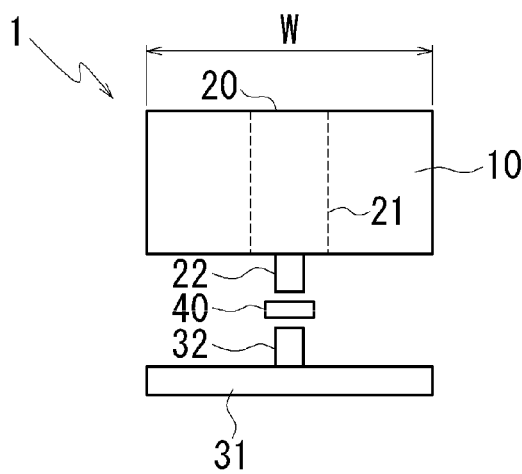
Figure 1B:
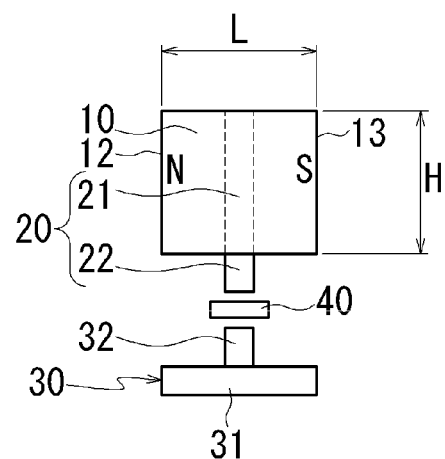
Figure 2:
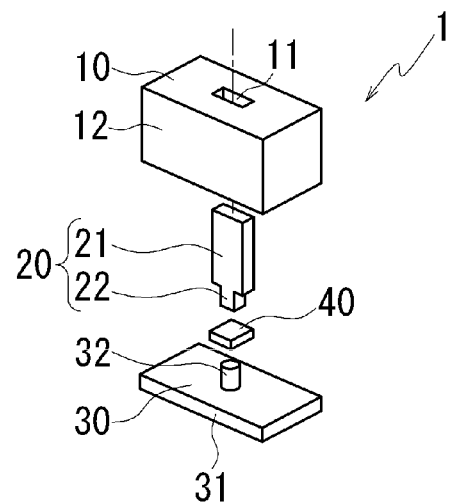
FIG. 2 is an exploded perspective view of the proximity sensor according to the first embodiment in the present invention.

FIG. 1A is a front view showing the configuration of a proximity sensor according to a first embodiment, FIG. 1B is a side view thereof, and FIG. 1C is a top view thereof. FIG. 2 is an exploded perspective view of the proximity sensor according to the first embodiment. A proximity sensor 1 comprises a permanent magnet (hereinafter, called a magnet) 10, a first yoke 20 held by the magnet 10, a hall IC 40 as a magnetic responsive element, and a second yoke 30. The magnet 10, as shown in FIG. 1B, has N pole and S pole at both ends in the right and left, and is formed in a rectangular parallelepiped having magnetic pole faces 12 and 13 each having a width W and a height H, and a length L. The first yoke 20 is held in a holding hole 11 of a rectangular traverse section that is formed in the center of the magnet 10 and penetrates from a top face to a bottom face thereof.

The first yoke 20 includes a fixed primary portion 21 that is formed in a plate shape and has the same height with the height H of the magnet 10, wherein a plate face of the fixed primary portion 21 is in parallel with the magnetic pole faces 12 and 13. A top end of the fixed primary portion 21 is flush with the top face of the magnet 10, a bottom end thereof is flush with the bottom face of the magnet 10, and a projecting portion 22 projects downward from the bottom end of the fixed primary portion 21 by a predetermined amount. The projecting portion 22 is formed to have a quadrangle in section one side of which is equivalent to the plate thickness. The plate face of the fixed primary portion 21 is in parallel with the magnetic pole faces 12 and 13. Specifically the magnet 10 is a bond magnet produced from rare-earth magnet powder by injection-molding, and the fixed primary portion 21 in the first yoke 20 is insert-molded at the injection-molding. In this case, the aforementioned holding hole 11 is a conceptual hole surrounding the fixed primary portion 21 to make contact with a peripheral face thereof. In addition, the magnet 10 can be magnetized after being assembled by holding at least the first yoke 20.

The second yoke 30 has a main body portion 31 that is formed in a plate shape thinner than the height H of the magnet 10, and has the same length and width as the length L and the width W of the magnet 10. In addition, a round bar-shaped protruding portion 32 having the same diameter as the projecting portion 22 of the first yoke 20 projects upwards by a predetermined amount from the center of the wall face of the main body portion 31 opposing the magnet 10, and opposes the projecting portion 22 to have a gap in between. It should be noted that the protruding portion 32 may have a cross section formed in a quadrangle one side of which is equivalent to the plate thickness in the same way with the projecting portion 22. In the present embodiment, the protruding portion 32 is formed in a round bar shape for easy production. Further, the hall IC 40 is arranged in the gap between the projecting portion 22 in the first yoke 20 and the protruding portion 32 in the second yoke 30. In the hall IC 40, the magnetic responsive direction is set in a direction of connecting the projecting portion 22 and the protruding portion 32.

Figure 3:
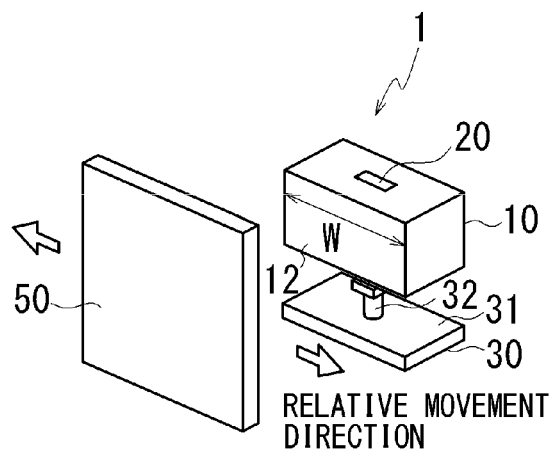
FIG. 3 is a diagram showing an arrangement relation between the proximity sensor and a detected member according to the first embodiment in the present invention.

The proximity sensor 1 configured as described above is, as shown in FIG. 3, arranged to the detected member 50 moving relative to the magnet 10 along the width W direction thereof such that the magnet 10 and the second yoke 30 are installed to oppose a moving face of the detected member 50 in such a manner that one of the magnetic pole faces in the magnet 10, for example, the magnetic pole face 12 of N pole is substantially in parallel with the plate face of the detected member 50. In the figure, outline arrows having a white space inside thereof indicate the relative moving direction. The detected member 50 may be formed of, for example, a plate made of a general iron material.

Figure 4:
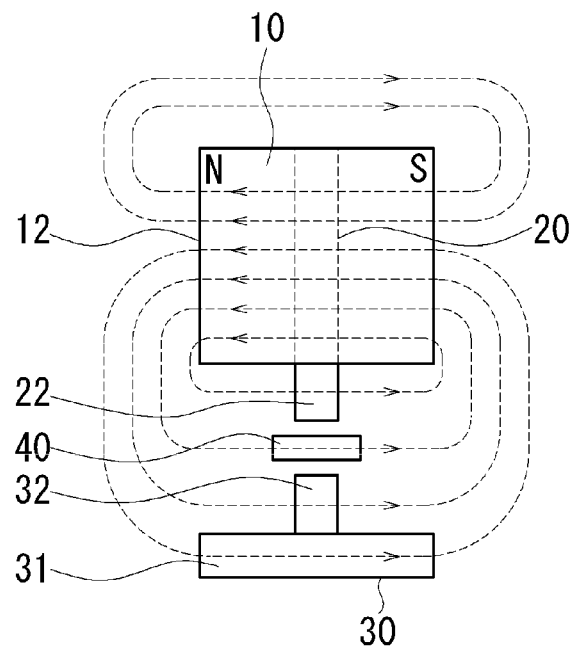
FIG. 4 is a diagram showing a magnetic circuit in a case where the detected member is placed to be sufficiently away from the proximity sensor according to the first embodiment in the present invention.

Next, an explanation will be made of an operation of the proximity sensor 1. FIG. 4 shows a magnetic circuit formed in a case where the detected member 50 is sufficiently away from the front side of the magnetic pole face 12 in the magnet 10, wherein the flowing direction of the magnetic flux shown in a broken line is indicated by an arrow. The magnetic flux that goes out from N pole (magnetic pole face 12) returns back to S pole (magnetic pole face 13) while drawing a loop passing through a space. At this time, a part of the magnetic fluxes that is in a side remote from the second yoke 30 passes through the space alone, but more magnetic fluxes go toward a side where the second yoke 30 is arranged, and traverse the projecting portion 22 of the first yoke 20, the main body portion 31 of the second yoke 30, the protruding portion 32, and the hall IC 40 in parallel, and then go into the space, while respectively flowing substantially in parallel with the wall face of the magnet 10 in the length L direction. Since the magnetic flux traversing the hall IC 40 is vertical to the magnetic responsive direction, the magnetic flux density is zero in a viewpoint of sensing capabilities, and the hall IC 40 is seemingly positioned in a non-magnetic field, therefore outputting an off (high) signal.

Figure 5:
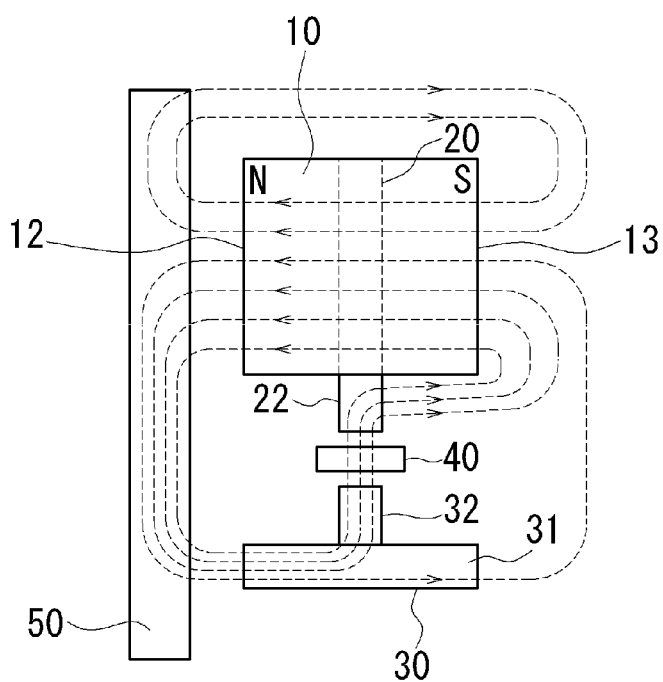
FIG. 5 is a diagram showing a magnetic circuit in a case where the detected member is placed to be close to the proximity sensor according to the first embodiment in the present invention.

On the other hand, in a case where the detected member 50 is positioned to be close to the front side of the magnetic pole face 12 in the magnet 10, a magnetic circuit shown in FIG. 5 is formed. Herein the detected member 50 comes to a position of opposing the magnetic pole face 12 of the magnet 10 and an end face of the second yoke 30. Particularly the magnetic fluxes, which flow toward a side where the second yoke 30 is arranged, pass through the detected member 50 via N pole, and thereafter flow into the main body portion 31 of the second yoke 30. Then a large part of the magnetic fluxes in the main body portion 31 flows in a direction of the first yoke 20 through the hall IC 40. The slight remaining portion of the magnetic fluxes that enter into the main body portion 31 of the second yoke 30 go directly through the space and return back to S pole in the same way with a case where the detected member 50 is sufficiently away from the front side of the magnetic pole face 12 in the magnet 10. At this time, the magnetic flux that flows from the second yoke 30 to the first yoke 20 via the hall IC 40 is throttled toward the projecting portion 22 having a small section, and is further throttled in the protruding portion 32 in a side of the second yoke 30. Therefore the magnetic flux concentrating on the small area passes through the hall IC 40 in a high density. Since the passing direction of the magnetic flux is along the magnetic responsive direction of the hall IC 40, the hall IC 40 detects a change in the magnetic flux density in high sensitivity and outputs an on (low) signal.

In a case where the length L of the magnet 10 is larger than the width W or the height H thereof, the magnetic flux that flows from the main body portion 31 of the second yoke 30 through the space and returns back to S pole increases when the detected member 50 comes sufficiently close to the magnetic pole face 12, and the magnetic flux density applied to the hall IC 40 from the protruding portion 32 in the second yoke 30 toward the projecting portion 22 in the first yoke 20 is made small. Therefore since a changing amount in the magnetic flux density between a case where the detected member 50 is away from the magnetic pole face 12 of the magnet 10 and a case where the detected member 50 is sufficiently close to the magnetic pole face 12 of the magnet 10 becomes small, the length L of the magnet 10 is controlled to be equal to or less than a value of the width W or the height H thereof. In addition, also in regard to the first yoke 20, when the plate width of the fixed primary portion 21 in parallel with the magnetic pole faces 12 and 13 is made to 20% to 40% of the width W of the magnet 10, a large changing amount in the magnetic flux density between a case where the detected member 50 is away from the magnetic pole face 12 of the magnet 10 and a case where the detected member 50 is sufficiently close to the magnetic pole face 12 of the magnet 10 can be obtained.

Figure 6:
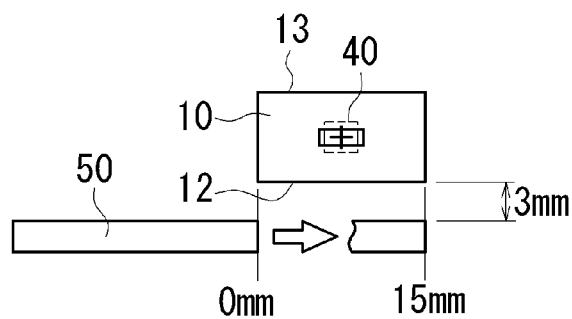
FIG. 6 is an explanatory diagram showing the measurement procedure of an operation characteristic of the proximity sensor according to the first embodiment in the present invention.

Hereinafter, a specific example of the first embodiment will be shown. A hall probe for a gauss meter is arranged instead of the hall IC 40, and as shown in FIG. 6, an opposing gap between the detected member 50 and the magnetic pole face 12 is set to 3 mm. A changing amount in the magnetic flux density was measured when the detected member 50 was moved between the separation position from and the opposing position to the magnet 10 (and the second yoke 30). Herein a position where a front end edge of the detected member 50 in the moving direction opposes an end of the magnet 10 in the width direction was set as 0 mm, wherein a changing amount in the magnetic flux density was measured in a range from a position (−5 mm) before the position (0 mm) of the front end edge of the detected member 50 to a position where the front end edge of the detected member 50 arrives at the other end of the magnet 10 in the width direction. Setting values of the proximity sensor 1 used for measurement are as follows.

Size of the magnet 10: Length (L)=8 mm, Width (W)=15 mm, and Height (H)=8 mm

Material of the first yoke 20: Sintered body of pure iron powder

Figure 7:
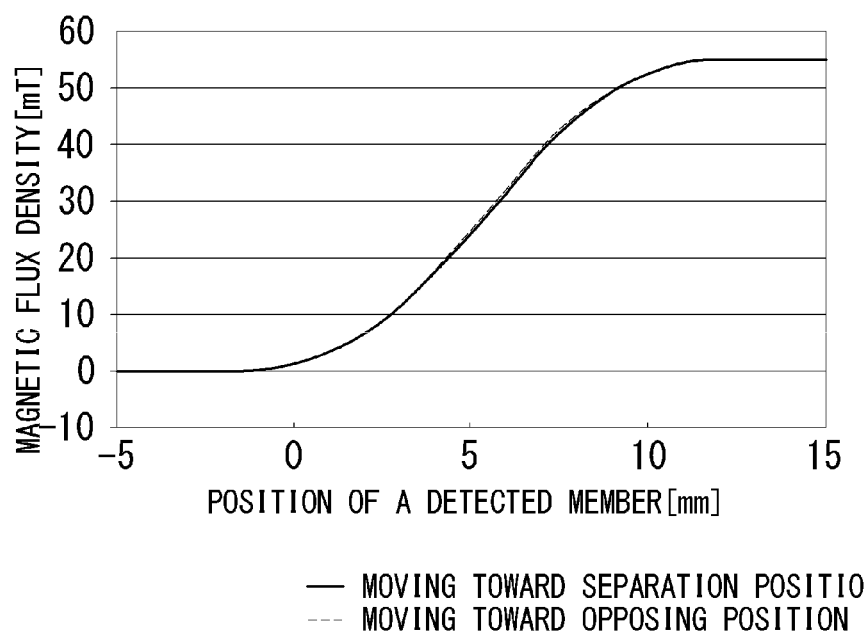
FIG. 7 is a diagram showing the measurement result of the operation characteristic of the proximity sensor according to the first embodiment in the present invention.

Size of the fixed primary portion 21: Width=4 mm, Height=8 mm, and Plate thickness=2 mm Size of the projecting portion 22: Width=2 mm, Plate thickness=2 mm, and Projecting amount=2 mm Material of the second yoke 30: Sintered body of pure iron powder Size of the main body portion 31: Width=15 mm, Length=8 mm, and Plate thickness=2 mm Size of the protruding portion 32: Diameter=2 mm, and Projecting amount=2 mm Material of the detected member 50: Iron plate As shown in the measurement result in FIG. 7, the maximum changing amount of the magnetic flux density was 55 mT. When the operation magnetic flux density of the hall IC 40 that is easy to obtain is set to 10 mT, an on state and an off state of the hall IC 40 is switched in a position where the front end of the detected member 50 enters into the opposing section to the magnet 10 substantially by 2.5 mm. The maximum changing amount of the magnetic flux density is a sufficient changing amount for the hall IC 40 having the operation magnetic flux density of 10 mT, indicating that the proximity sensor 1 has a high practical use as a vehicular pedal sensor and the other sensor. In addition, in the present embodiment, the plate face of the fixed primary portion 21 in the first yoke 20 is arranged in parallel with the magnetic pole faces 12 and 13. Therefore, according to a different measurement, the present embodiment has an advantage that the magnetic flux density in the hall IC 40 increases by 10% in a case where the detected member is positioned to be close to the magnetic pole face as compared to a case where the plate face of the fixed primary portion 21 is positioned to be vertical to the magnetic pole face.

Figure 8:
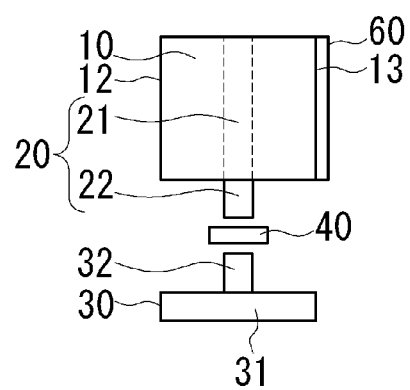
FIG. 8 is a diagram showing the configuration of a proximity sensor according to a modification of the first embodiment in the present invention.
Figure 9:
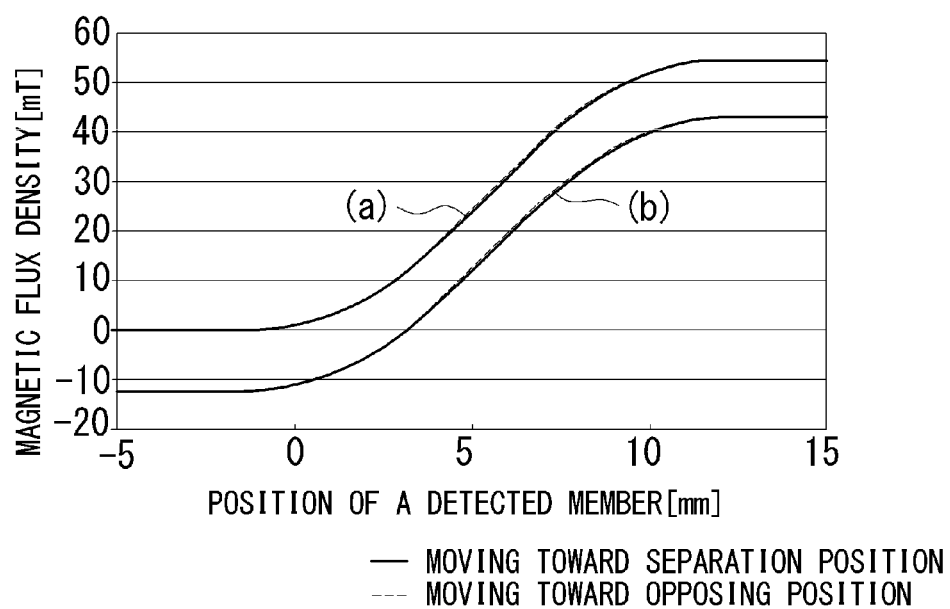
FIG. 9 is a diagram showing the measurement result of the operation characteristic of the proximity sensor according to the modification of the first embodiment in the present invention.

It should be noted that in addition to the above-mentioned measurement, as shown in FIG. 8, a changing amount of the magnetic flux density in a proximity sensor configured as a modification of the above example as follows was measured. That is, an iron plate 60 that has the same shape (W=15 mm and H=8 mm) with the magnetic pole face 13 at the opposite side to the magnetic pole face 12 opposing the detected member 50 in the magnet 10 and has the plate thickness of 0.5 mm was attached to the magnetic pole face 13 to make close contact therewith. The other measurement condition was the same as the above example. FIG. 9 shows the measurement result. As compared to the magnetic flux density curve (a) in a case where the iron plate 60 was not attached to the magnetic pole face 13, the magnetic flux density curve (b) in a case where the iron plate 60 was attached thereto was offset in the reduction direction by 12 mT. Therefore, when the hall IC 40 having the operation magnetic flux density of 10 mT is used, an on state and an off state of the hall IC 40 is switched in a position where the front end of the detected member 50 enters into the opposing section to the magnet 10 by 4.5 mm. As a result, in the present example, the magnetic flux density curve can be offset by attaching the iron plate 60 to the magnetic pole face 13, thus adjusting the detection position of the detected member 50. The offset amount can be controlled by selection of the plate face size or the plate thickness of the iron plate 60. The other magnetic material may be adopted instead of the iron plate 60. Therefore when the process of the detection position adjustment is provided in the manufacturing process, a yield ratio of the proximity sensor remarkably increases, and the product requirement differing in a detection position specification of the detected member can be realized without making a change in the basic configuration and the components in the proximity sensor.

Inn the present embodiment, the hall IC 40 corresponds to a magnetic responsive element in the present invention, and the iron plate 60 corresponds to a detection position adjustment plate in the present invention.

The proximity sensor 1 in the present embodiment is configured as described above, and comprises the single magnet 10, the first yoke 20 that is held in the intermediate position between the two magnetic pole faces 12 and 13 of the magnet 10 and includes the projecting portion 22 projecting from the wall face of the magnet 10 vertical to the magnetic pole face, the second yoke 30 that includes the main body portion 31 in parallel with the wall face of the magnet 10 from which the projecting portion 22 projects and the protruding portion 32 opposing the projecting portion 22, and is arranged to have a space to the projecting portion 22, and the hall IC 40 that is arranged in the space between the projecting portion 22 and the protruding portion 32, wherein the magnet 10 is arranged to position the magnetic pole face 12 to be in parallel with the detected member 50 moving relative thereto. Therefore the proximity sensor can be formed of a simple structure comprising a fewer components by adopting the single magnet, and therefore can realize the detection with high accuracy by thus solving the problem of the variation in characteristics of the magnet that is unavoidable at the time of requiring a plurality of magnets. Further, when the detected member 50 comes to a position close to the opposing position to the magnetic pole face 12, the magnetic flux flows in the hall IC 40 in the magnetic responsive direction from the second yoke 30 to the first yoke 20 to be throttled intensively in the projecting portion 22 and in the protruding portion 32. Therefore the change in the magnetic flux density is detected in a high sensitivity.

In addition, since the length L between the magnetic pole faces 12 and 13 of the magnet 10 is equal to or less than the width W or the height H of the magnetic pole faces 12 and 13, the changing amount of the magnetic flux density that is detected by the hall IC 40 between a case where the detected member 50 is away from the magnetic pole face 12 of the magnet 10 and a case where the detected member 50 is sufficiently close to the magnetic pole face 12 of the magnet 10 can be largely obtained.

In the first yoke 20, the projecting portion 22 extends from the plate-shaped, fixed primary portion 21 arranged in the outer shape of the magnet 10, and the plate width of the fixed primary portion 21 is larger in size than the projecting portion 22. Therefore the holding force by the magnet 10 is large, and the large changing amount of the magnetic flux density can be obtained between a case where the detected member 50 is away from the magnetic pole face 12 of the magnet 10 and a case where the detected member 50 is sufficiently close to the magnetic pole face 12 of the magnet 10. In addition, particularly the magnet 10 is the bond magnet that is injection-molded from the rare-earth magnet powder, and at the time of the injection-molding, the fixed primary portion 21 of the first yoke 20 is embedded in the magnet 10 by the insert-molding to rigidly connect the first yoke 20 to the magnet 10. Therefore the variation in the characteristic of the magnet 10 due to the assembly is extremely small. In addition, since the magnet 10 is magnetized in an assembling state of holding at least the first yoke 20, as compared to a case of assembling the first yoke 20 after the magnet 10 is magnetized, the excessive management for preventing attachment of, for example, foreign objects (magnetic powder effecting an adverse influence on the characteristic of the magnet 10 or the like) floating in the manufacturing line to the magnet 10 can be alleviated.

In addition, even if the requirement for the specification of a different detection position of the detected member 50 is made or even if the characteristic of the magnet 10 varies depending upon its individual, the magnetic material such as the iron plate 60 is attached to the magnetic pole face 13 at the opposite side to the magnetic pole face 12 opposing the detected member 50 of the magnet 10, thereby making it possible to easily and finely adjust the detection position of the detected member 50.

Second Embodiment

Next, a proximity sensor according to a second embodiment in the present invention will be explained.

Figure 10C:
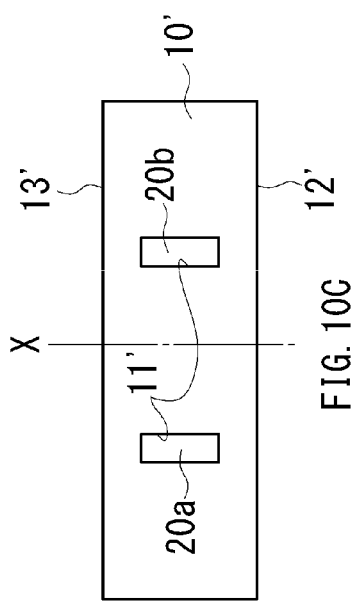
FIGS. 10A, 10B and 10C are diagrams each showing the configuration of a proximity sensor according to a second embodiment in the present invention.
Figure 10B:
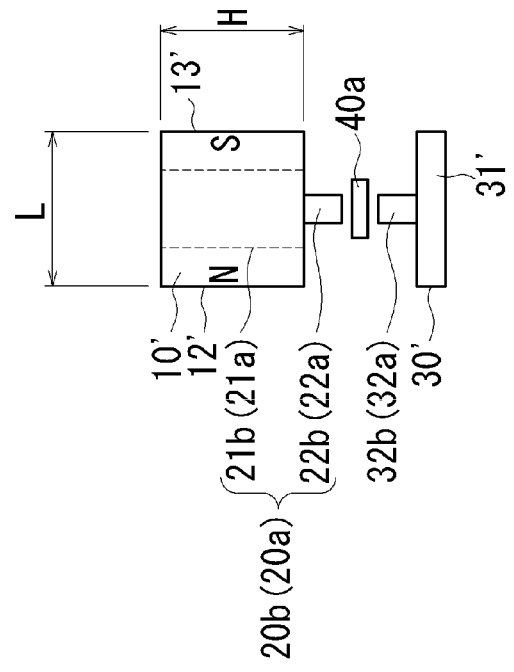
Figure 10A:
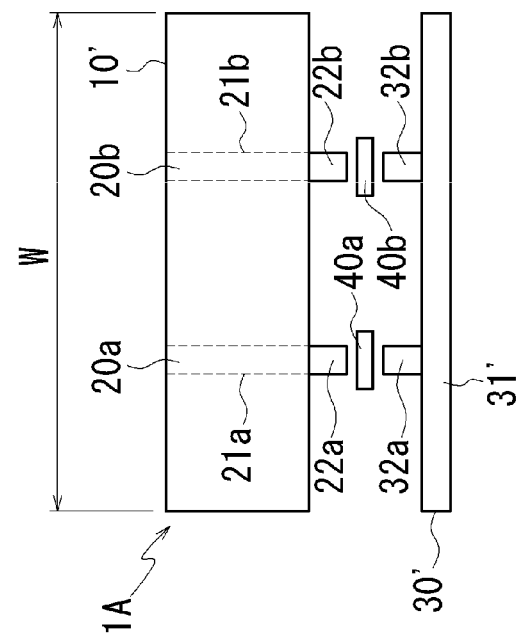
Figure 11:
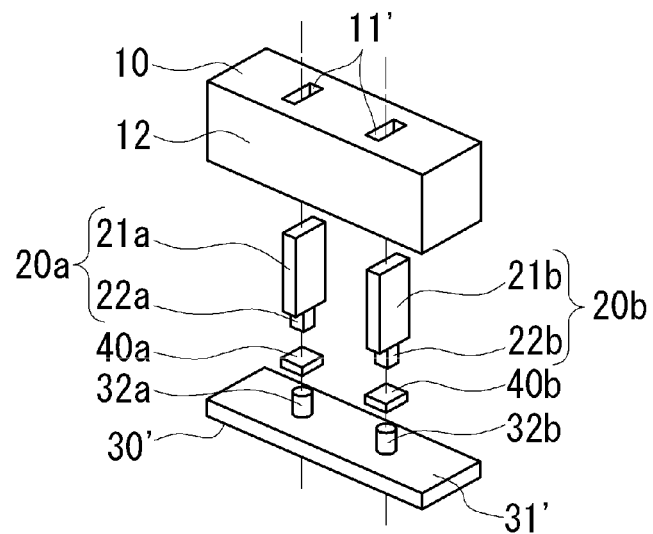
FIG. 11 is an exploded perspective view of the proximity sensor according to the second embodiment in the present invention.

FIG. 10A is a front view showing the configuration of a proximity sensor according to a second embodiment, FIG. 10B is a side view thereof, and FIG. 10C is a top view thereof. FIG. 11 is an exploded perspective view of the proximity sensor according to the second embodiment. A proximity sensor 1A in the second embodiment comprises a permanent magnet 10', two first yokes 20a and 20b held by the magnet 10', two hall IC 40a and 40b, and a second yoke 30'. The magnet 10', in FIG. 10B, has N pole and S pole at both ends in the right and left, and is formed in a rectangular parallelepiped having magnetic pole faces 12' and 13' each having a width W and a height H, and a length L. Herein the width (W) dimension is longer than the magnet in the first embodiment. Holding holes 11' each having a rectangular traverse section are provided at both sides of the magnet 10' having the center line X in the width of the magnet 10' in between to penetrate from a top face to a bottom face in an intermediate position between the magnetic pole faces 12' and 13', and each of the first yokes 20a and 20b having a cross section aligning with the holding hole 11' is held in the holding hole 11'.

The first yoke 20a has the same shape as that of the first yoke 20b. Each of fixed primary portions 21a and 21b in the first yokes 20a and 20b is formed in a plate shape to have the same height as the height H of the magnet 10', and each of projecting portions 22a and 22b projects downwards from the bottom end of each by a predetermined amount. In addition, a top end of each of the fixed primary portions 21a and 21b is flush with the top face of the magnet 10', a bottom end thereof is flush with the bottom face of the magnet 10', and each of projecting portions 22a and 22b is formed to have a quadrangle in section one side of which is equivalent to the plate thickness. In the present embodiment, the plate faces of the fixed primary portions 21a and 21b are vertical to the magnetic pole faces 12' and 13' such that two detection positions to be described later can be set to any broad/narrow size. In addition, in the same way with the above-mentioned embodiment, the magnet 10' is a rare-earth bond magnet produced by injection-molding, and each of the fixed primary portions 21a and 21b in the first yokes 20a and 20b is insert-molded at the injection-molding.

The second yoke 30' has a main body portion 31' that is formed in a plate shape thinner than the height H of the magnet 10', has the same length and width as the length L and the width W of the magnet 10', and opposes the wall face of the magnet 10' from which the projecting portions 22a and 22b project. In addition, round bar-shaped protruding portions 32a and 32b project by a predetermined amount from the wall face of the main body portion 31' to oppose the projecting portions 22a and 22b of the first yokes 20a and 20b. Each diameter of the protruding portions 32a and 32b is equivalent to that of each of the projecting portions 22a and 22b and opposes each of the projecting portions 22a and 22b to have a gap in between. Further, the hall IC 40a and 40b respectively are arranged in the gap between each of the projecting portions 22a and 22b in the first yokes 20a and 20b and each of the protruding portions 32a and 32b in the second yoke 30'. In the hall IC 40a, the magnetic responsive direction is set in a direction of connecting the projecting portion 22a and the protruding portion 32a, and in the hall IC 40b also, the magnetic responsive direction is set in a direction of connecting the projecting portion 22b and the protruding portion 32b. The other components are the same as those in the first embodiment.

Figure 12:
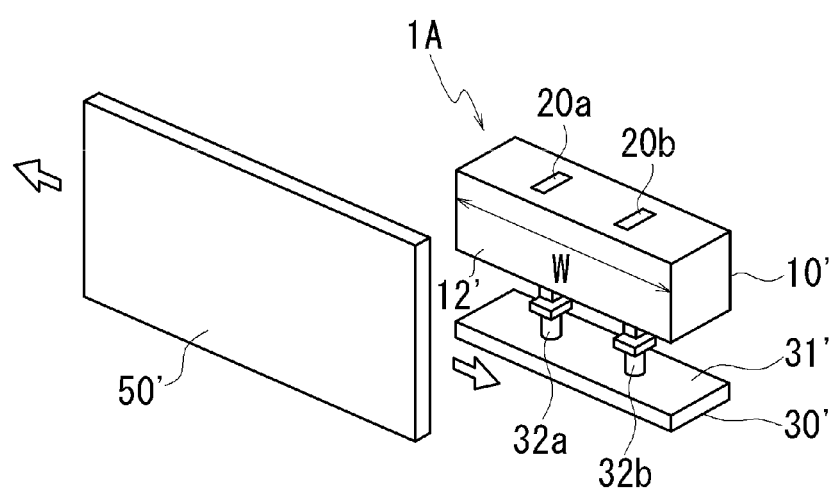
FIG. 12 is a diagram showing an arrangement relation between the proximity sensor and a detected member according to the second embodiment in the present invention.

The proximity sensor 1A is, as shown in FIG. 12, configured such that the magnet 10' and the second yoke 30' are installed to oppose a moving face of the detected member 50' of the iron plate moving relative to the magnet 10' along the width W direction thereof in such a manner that one magnetic pole face 12' in the magnet 10' is substantially in parallel with the plate face of the detected member 50'.

Figure 13:
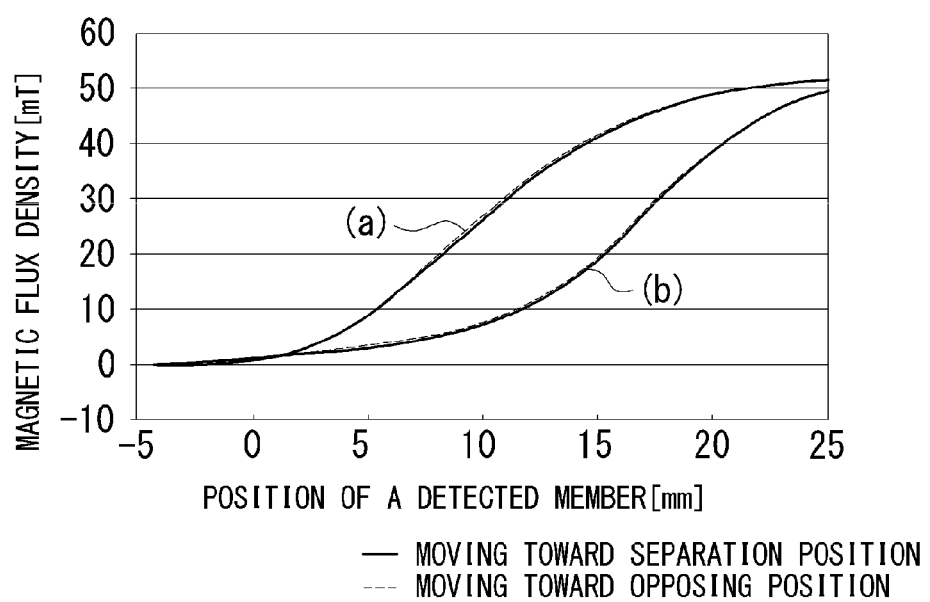
FIG. 13 is a diagram showing the measurement result of the operation characteristic of the proximity sensor according to the second embodiment in the present invention.

As similar to the above-mentioned embodiment, specifically an opposing gap between the detected member 50' and the magnetic pole face 12' is set to 3 mm. A changing amount in the magnetic flux density was measured when the detected member 50' was moved in a range from a position before an end of the magnet 10' (and the second yoke 30') in the width direction to the opposing position thereto. The measurement result is shown in FIG. 13. Herein also, a position where a front end edge of the detected member 50' in the moving direction opposes the end of the magnet 10' in the width direction is set to 0 mm. Setting values of the proximity sensor 1 used for measurement are as follows.

Size of the magnet 10': Length (L)=8 mm, Width (W)=26 mm, and Height (H)=8 mm

Material of the first yokes 20a and 20b: Sintered body of pure iron powder

Size of the fixed primary portions 21a and 21b: Width=4 mm, Height=8 mm, and Plate thickness=2 mm Size of the projecting portions 22a and 22b: Width=2 mm, Plate thickness=2 mm, and Protruding amount=2 mm Material of the second yoke 30': Sintered body of pure iron powder Size of the main body portion 31: Width=26 mm, Length=8 mm, and Plate thickness=2 mm Size of the protruding portion 32: Diameter=2 mm, and Protruding amount=2 mm Material of the detected member 50': Iron plate As shown in FIG. 13, the maximum changing amount of the magnetic flux density in the gap between the projecting portion 22a and the protruding portion 32a (arrangement portion of the hall IC 40a) was 51 mT, and the maximum changing amount of the magnetic flux density in the gap between the projecting portion 22b and the protruding portion 32b (arrangement portion of the hall IC 40b) was 49 mT. When the operation magnetic flux density of the hall IC 40a and 40b is set to 10 mT, an on state and an off state of the hall IC 40a is switched in a position where the front end of the detected member 50' enters into the opposing section to the magnet 10' by 5 mm, and an on state and an off state of the hall IC 40b is switched in a position where the front end of the detected member 50' enters into the opposing section to the magnet 10' by 12 mm. Therefore the position of the detected member 50' can be detected in two steps, and as needed, by further adding a set of the projecting portion of the first yoke, the protruding portion of the second yoke and the hall IC arranged in the gap therebetween, the position detection of the detected member can be performed in a multi-step.

Also in the present embodiment, as similar to the above-mentioned embodiment, by attaching a magnetic material similar to the iron plate 60 or the like to the magnetic pole face 13' at the opposite side to the magnetic pole face 12' opposing the detected member 50' of the magnet 10', the magnetic flux density curve can be offset to adjust the detection position of the detected member 50'.

In the present embodiment, the hall ICs 40a and 40b correspond to magnetic responsive elements in the present invention.

The proximity magnet 1A in the present embodiment is configured as described above, and comprises the single permanent magnet 10', the first yokes 20a and 20b that are held in an intermediate position between the two magnetic pole faces 12' and 13' of the permanent magnet 10' and include the projecting portions 22a and 22b respectively projecting from the wall face vertical to the magnetic pole faces 12' and 13', the second yoke 30' that includes the main body portion 31' in parallel with the wall face of the permanent magnet 10' from which the projecting portions 22a and 22b project and is arranged to have a space to the projecting portions 22a and 22b, and the hall ICs 40a and 40b that are arranged respectively in the spaces between the projecting portions 22a and 22b and the second yoke 30', wherein the magnet 10' is arranged to position the magnetic pole face 12' to be in parallel with the detected member 50' moving relative thereto. Therefore the proximity sensor can be formed of a simple structure comprising a fewer components by adopting the single magnet, and therefore can realize the detection with high accuracy by solving the problem of the variation in characteristics of the magnet that is unavoidable at the time of requiring a plurality of magnets. Besides, the present embodiment has the same effect as that of the first embodiment.

In addition, the present embodiment is provided with two sets of magnetic flux density detection components composed of a first set of the first yoke 20a and the hall IC 40a arranged in the space between the projecting portion 22a and the second yoke 30', and a second set of the first yoke 20b and the hall IC 40b arranged in the space between the projecting portion 22b and the second yoke 30'. Therefore the present embodiment can realize a particular effect that the position of the detected member 50' can be detected in two steps with the single proximity sensor having a simple structure in which the number of the magnet is restricted to only one.

It should be noted that the first or second embodiment and the measurement result thereof are shown based upon the example in which the detected member 50 or 50' moves in a parallel direction relative to the magnetic pole faces 12 or 12' of the magnet, but the present invention is not limited thereto. Also when the present invention is applied to a case where the detected member 50 or 50' moves in a vertical direction relative to the magnetic pole face 12 or 12', the position of the detected member can be detected with high accuracy without being subject to the influence of the variation in the characteristic of the magnet. It should be noted that in the second embodiment, in a case where the detected member 50' moves in the vertical direction relative to the magnetic pole face 12', since the position of the detected member is detected by the two hall ICs 40a and 40b, the double detection can be performed to improve the reliability.

In the embodiments, the magnets 10 and 10' are formed of the rare-earth bond magnets, but a bond magnet using the other magnetic material may be adopted. In addition, the first yoke 20, 20a or 20b is integrally jointed to the magnet 10 or 10' by insert-molding the fixed primary portion 21 and the like at the time of injection-molding the magnets 10 or 10', but in a case where the first yoke is assembled after molding the magnet, it is preferable that the fixed primary portion 21 or the like is formed to have a cross section aligned with the holding hole 11 or 11' of the magnet and the entire periphery of four faces of the fixed primary portion makes close contact with the wall face of the holding hole. In addition, the height dimension of the fixed primary portion 21, 21a or 21b of the first yoke is the same as the height H of the magnet 10 or 10', and the top end thereof at the opposite side to the projecting portion 22, 22a or 22b is flush with the top face of the magnet 10 or 10', but the height dimension is only required to be at least 50% or more of the height H of the magnet, and the top end is not necessary to be exposed to the top face of the magnet. On the other hand, the structure that the top end projects from the top face of the magnet 10 is not preferable since the magnetic flux density passing through a side of the hall IC 40 is made small.

Further, particularly the first embodiment has an advantage that the plate face of the fixed primary portion 21 in the first yoke 20 is arranged in parallel with the magnetic pole faces 12 and 13 to obtain a relatively large magnetic flux density in a region of the hall IC 40, but as needed, as in the case of the second embodiment, the plate face of the fixed primary portion may be arranged to be vertical to the magnetic pole face. The reverse structure can have the same effect.

In the embodiments, the protruding amount of each of the projecting portions 22, 22a and 22b of the first yoke is set to 2 mm as a specific example, but as long as the protruding amount is at least 1.0 mm, the high magnetic flux density can be ensured in each of the hall ICs 40, 40a and 40b in a case where the detected member is positioned to be close to the magnetic pole face. In addition, the section size of the projecting portion is set to a diameter of 2 mm in the specific example, but if it is equivalent to a diameter of 3 mm or less, the high magnetic flux density can be obtained. However, when the section size is smaller than a diameter equivalent to 1 mm, the magnetic flux density is made large, but it is difficult for the projecting portions 22, 22a and 22b of the first yoke to accurately oppose the protruding portions 32, 32a and 32b in the second yoke respectively, and therefore, variations on assembling tend to be easily generated. The above-mentioned matter can be likewise applied to the projecting amount and section size of the protruding portion in the second yoke.

The hall IC 40 or the like is used as the magnetic responsive element, but a hall element, an MR element, a GMR element, and the other element may appropriately be adopted as the magnetic responsive element. The hall IC 40 in the embodiment has the particular magnetic responsive direction, but also in a case of using a magnetic responsive element of all-direction responsive type, close approach/separation of the detected member can be detected based upon a magnitude of the passing magnetic flux amount. It should be noted that the present invention is particularly effective by being applied to a pedal sensor, a door opening/closing sensor, a hood opening/closing sensor, a seat positioning sensor, or a seat belt strapping sensor for a vehicle. However, the present invention is not limited to an application to a vehicle, but can be applied to various uses for detecting the position of the detected member in non-contact.

While only the selected embodiments have been chosen to illustrate the present invention, it will be apparent to those skilled in the art from this disclosure that various changes and modifications can be made therein without departing from the scope of the invention as defined in the appended claims. Furthermore, the foregoing description of the embodiment according to the present invention is provided for illustration only, and not for the purpose of limiting the invention as defined by the appended claims and their equivalents.

DESCRIPTION OF REFERENCE SIGNS 1, 1A Proximity sensor
10, 10' Magnet (permanent magnet)
11, 11' Holding hole
12, 12', 13, 13' Magnetic pole face
20, 20a, 20b First yoke
21, 21a, 21b Fixed primary portion
22, 22a, 22b Projecting portion
30, 30' Second yoke
31, 31' Main body portion
32, 32a, 32b Protruding portion
40, 40a, 40b Hall IC (magnetic responsive element)
50, 50' Detected member

What is claimed is:

1. A proximity sensor comprising:
a single permanent magnet having the form of a rectangular parallelepiped having N and S poles at pole faces which are a pair of opposite faces and are parallel to each other;
a first yoke that is held in an intermediate position between two magnetic pole faces of the permanent magnet and includes a projecting portion projecting from a wall face of the permanent magnet vertical to the magnetic pole face;
a second yoke that includes a main body portion in parallel with the wall face of the permanent magnet from which the projecting portion projects and is arranged to have a space to the projection portion; and
a magnetic responsive element that is arranged in the space between the projecting portion and the second yoke, wherein the permanent magnet is arranged to position the magnetic pole face to be in parallel with the detected member moving relative thereto;
wherein the permanent magnet defines a holding hole in a center of the permanent magnet and penetrating the magnet from a top face to a bottom face in parallel with the pole faces, the first yoke being held in the intermediate position in the holding hole.

2. A proximity sensor according to claim 1, wherein a length between the magnetic pole faces of the permanent magnet is equal to or less than a width or a height of the magnetic pole face.

3. A proximity sensor according to claim 1, wherein
the first yoke extends the projecting portion from a plate-shaped, fixed primary portion arranged within an outer shape of the permanent magnet, and
the projecting portion is thinner than a plate width of the fixed primary portion.

4. A proximity sensor according to claim 1, wherein
the second yoke further includes a protruding portion extending from the main body portion to oppose the projecting portion of the first yoke, and
the magnetic responsive element is arranged in a space between the projecting portion and the protruding portion.

5. A proximity sensor according to claim 1, wherein a detection position adjusting plate made of a magnetic material is attached to the magnetic pole face at the opposite side to the magnetic pole face of the permanent magnet opposing the detected member.

6. A proximity sensor according to claim 1, wherein a plurality of sets each comprising the first yoke including the projecting portion, and the magnetic responsive element arranged in the space between the projecting portion and the second yoke are provided to detect a plurality of positions of the detected member.

7. A proximity sensor according to claim 1, wherein
the permanent magnet is formed by injection-molding, and
the first yoke is insert-molded at the injection-molding of the permanent magnet.

8. A proximity sensor according to claim 1, wherein the permanent magnet is magnetized in a state of holding at least the first yoke.

* * * * *